United States Patent
Ono et al.

(10) Patent No.: US 12,012,498 B2
(45) Date of Patent: Jun. 18, 2024

(54) SUBSTRATE AND METAL LAMINATE

(71) Applicant: AGC Inc., Tokyo (JP)

(72) Inventors: Motoshi Ono, Tokyo (JP); Kanji Arai, Tokyo (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 17/580,798

(22) Filed: Jan. 21, 2022

(65) Prior Publication Data

US 2022/0145043 A1    May 12, 2022

Related U.S. Application Data

(63) Continuation of application No. PCT/JP2020/029101, filed on Jul. 29, 2020.

(30) Foreign Application Priority Data

Aug. 6, 2019 (JP) .................... 2019-144495

(51) Int. Cl.
*C08K 3/36* (2006.01)
*C08J 5/18* (2006.01)

(52) U.S. Cl.
CPC ................. *C08K 3/36* (2013.01); *C08J 5/18* (2013.01); *C08J 2327/18* (2013.01)

(58) Field of Classification Search
None
See application file for complete search history.

(56) References Cited

U.S. PATENT DOCUMENTS

2019/0100635 A1  4/2019  Hosoda et al.
2019/0144700 A1  5/2019  Hosoda et al.

FOREIGN PATENT DOCUMENTS

| CN | 110278654 A | 9/2019 |
| JP | 63-259907 A | 10/1988 |
| JP | 2006-228871 A | 8/2006 |
| JP | 2019-183005 A | 10/2019 |
| WO | WO 2017/222027 A1 | 12/2017 |
| WO | WO 2018/016644 A1 | 1/2018 |
| WO | WO 2019/087939 A1 | 5/2019 |

OTHER PUBLICATIONS

English translation of Hosoda et al. WO 2017/222027 (Year: 2017).*
English translation of Umeda et al. (WO 2017/017923) (Year: 2017).*
International Search Report dated Sep. 24, 2020 in PCT/JP2020/029101 filed on Jul. 29, 2020, 3 pages.

* cited by examiner

*Primary Examiner* — Ronak C Patel
(74) *Attorney, Agent, or Firm* — Oblon, McClelland, Maier & Neustadt, L.L.P.

(57) ABSTRACT

A substrate with a tetrafluoroethylene polymer and an inorganic filler, wherein the proportion of the total volume of the tetrafluoroethylene polymer and the inorganic filler to the total volume of the present substrate is at least 80 vol %, and the substrate has a rate of change in dielectric loss tangent at 10 GHz before and after 72 hours of unsaturated pressure cooker test at 120° C. under 85% RH on a 127-μm thick specimen cut out from the substrate is at most 30%.

10 Claims, 1 Drawing Sheet

SUBSTRATE AND METAL LAMINATE

TECHNICAL FIELD

The present invention relates to a substrate and a metal laminate.

BACKGROUND ART

Along with the demand for smaller and more sophisticated electronic devices, an insulating layer (substrate) that constitutes a printed wiring board to be used in an electronic device is required to have electrical characteristics such as low dielectric constant and low dielectric loss tangent, as well as low thermal expansion coefficient and heat resistance. In particular, in order to stably mount an electronic component on the printed wiring board, it is important to suppress warpage of the printed wiring board caused by the heat during mounting. In order to suppress warpage of the printed wiring board, it is important that the insulating layer has a low thermal expansion coefficient.

As an insulating layer with a low thermal expansion coefficient, an insulating layer comprising an inorganic filler and a resin has been proposed (Patent Documents 1 and 2).

PRIOR ART DOCUMENTS

Patent Documents

Patent Document 1: JP-A-2006-228871
Patent Document 2: JP-A-S63-259907

DISCLOSURE OF INVENTION

Technical Problem

In order to reduce the thermal expansion coefficient of the insulating layer, it is preferred to add an inorganic filler in a large amount to the resin. However, since the relative permittivity of an inorganic filler is higher than that of a resin, if the amount of the inorganic filler added increases, there will be such a problem that the relative permittivity of the insulating layer becomes high.

If a fluoropolymer is used as a resin, electrical properties such as dielectric loss tangent and relative permittivity will be improved, but by simply mixing a fluoropolymer and an inorganic filler, there will be such a problem that the mechanical strength of the insulating layer will be low and a problem that the transmission loss will be large. If the mechanical strength of the insulating layer is low, it cannot be used for a printed wiring board to be used in an environment with vibration, such as an automobile, etc., and thus, the application will be limited.

The present invention provides a substrate with low dielectric loss tangent, relative permittivity, transmission loss and thermal expansion coefficient, and excellent in mechanical strength, and a metal laminate using the same.

Solution to Problem

The present invention has the following embodiments.

[1] A substrate comprising a tetrafluoroethylene polymer and an inorganic filler, wherein the rate of change in dielectric loss tangent at 10 GHz before and after 72 hours of unsaturated pressure cooker test at 120° C. under 85% RH on a 127 μm thick specimen cut out from the substrate is at most 30%.

[2] The substrate according to [1], wherein the tetrafluoroethylene polymer is a polymer having units based on tetrafluoroethylene and units based on a perfluoro(alkyl vinyl ether) or units based on hexafluoropropylene.

[3] The substrate according to [1] or [2], wherein the tetrafluoroethylene polymer is a polymer having at least one type of functional groups selected from the group consisting of carbonyl group-containing groups, hydroxy groups, epoxy groups, amide groups, amino groups and isocyanate groups.

[4] The substrate according to [3], wherein the polymer having the functional groups is a polymer having monomer units having the functional groups.

[5] The substrate according to any one of [1] to [4], wherein the inorganic filler is silica.

[6] The substrate according to any one of [1] to [5], wherein the thickness of the substrate is from 60 to 500 μm.

[7] The substrate according to any one of [1] to [6], wherein the substrate further contains a surfactant.

[8] The substrate according to [7], wherein the surfactant is a fluorosurfactant.

[9] A metal laminate having a substrate as defined in any one of [1] to [8] and a metal layer located in contact with at least one surface of the substrate.

[10] The metal laminate according to [9], wherein the metal layer is a layer made of a copper foil.

[11] The metal laminate according to [9] or [10], wherein the ten-point average roughness of the surface of the metal layer in contact with the substrate is at most 2.0 μm.

[12] The metal laminate according to any one of [9] to [11], wherein the peel strength of the interface between the substrate and the metal layer is at least 5 N/cm.

Advantageous Effects of Invention

The substrate of the present invention has low dielectric loss tangent, relative permittivity, transmission loss and thermal expansion coefficient, and is excellent in mechanical strength.

The substrate with the metal laminate of the present invention has low dielectric loss tangent, relative permittivity, transmission loss and thermal expansion coefficient, and is excellent in mechanical strength.

EMBODIMENTS OF INVENTION

The definitions of the following terms are as follows.

Unsaturated Pressure Cooker Test (hereinafter referred to also as USPCT) is a pressure cooker test under 85% RH and is referred to also as HAST (High Accelerated Stress Test).

USPCT is conducted in accordance with the method specified in IEC 60068-2-66:1994 (corresponding JIS standard: JIS C 0096:2001).

The rate of change in dielectric loss tangent at 10 GHz before and after 72 hours of USPCT at 120° C. under 85% RH for a 127 μm thick specimen is calculated by the following formula (1).

Rate (%) of change in dielectric loss tangent=(Dielectric loss tangent of specimen after USPCT−Dielectric loss tangent before USPCT)/Dielectric loss tangent before USPCT×100          (1).

The dielectric loss tangent and relative permittivity are the values of dielectric loss tangent and relative permittivity measured at 25° C. and 10 GHz using a cavity resonator and a vector network analyzer in accordance with the method specified in JIS R 1641:2007.

The ten-point average roughness (hereinafter referred to also as "Rzjis") is the value measured by using the Surfcoder SE600 manufactured by Kosaka Laboratory Ltd. in accordance with the method specified in Annex JA of JIS B 0601:2013.

The peel strength is the value measured by the method described in Examples given later.

In the present invention, a tetrafluoroethylene polymer (hereinafter referred to also as a "TFE polymer") means a polymer having units based on tetrafluoroethylene (hereinafter referred to also as "TFE").

In this specification, "units based on a monomer" are referred to also as "monomer units". For example, "units based on TFE" are referred to also as "TFE units".

Figure 1:
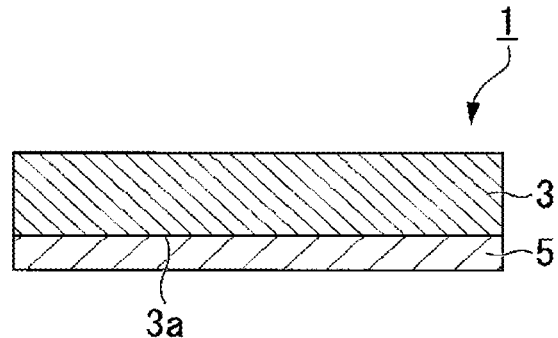
FIG. 1 is a schematic cross-sectional view showing an example of the metal laminate of the present invention.
Figure 2:
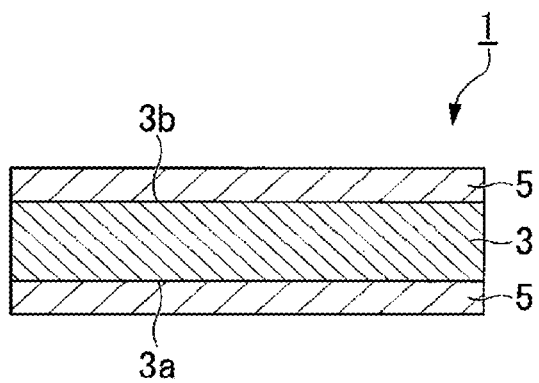
FIG. 2 is a schematic cross-sectional view showing another example of the metal laminate of the present invention.

The dimensional ratios in FIG. 1 and FIG. 2 are different from the actual ones for convenience of explanation.

[Substrate]

The substrate of the present invention (hereinafter referred to also as "the present substrate") comprises a TFE polymer and an inorganic filler.

The relative permittivity of the TFE polymer is preferably at most 6.0, more preferably at most 3.5, particularly preferably at most 3.0. When the relative permittivity is at most the above upper limit value, the present substrate can be suitably used for a printed wiring board, etc., where a low dielectric constant is required.

The relative permittivity of the TFE polymer is preferably at least 1.5 from the viewpoint of the electrical properties of the substrate.

The TFE polymer is preferably a melt-moldable polymer. "Melt-moldable" means to show melt flowability. "Show melt flowability" means that there is a temperature at which the melt flow rate becomes to be from 0.1 to 1,000 g/10 min at a temperature higher by at least 20° C. than the melting point of the TFE polymer under a condition of a load of 49 N. The "melt flow rate" means the melt mass flow rate (MFR) specified in JIS K 7210:1999 (ISO 1133:1997).

The melting point of the TFE polymer is preferably above 260° C., more preferably above 260° C. and at most 320° C., particularly preferably from 275 to 320° C. When the melting point of the TFE polymer is within the above range, the TFE polymer is sintered while retaining its elasticity-based adhesiveness, whereby it becomes easy to form a dense substrate.

MFR of the TFE polymer is preferably from 0.5 to 100 g/10 min, more preferably from 1 to 30 g/10 min, particularly preferably from 5 to 20 g/10 min.

The TFE polymer preferably has a temperature range showing a storage modulus of from 0.1 to 5.0 MPa, at a temperature of at most 260° C. The storage modulus which the TFE polymer shows in the above temperature range is preferably from 0.2 to 4.4 Mpa, particularly preferably from 0.5 to 3.0 Mpa. The temperature range which the TFE polymer shows such a storage modulus is preferably from 180 to 260° C., particularly preferably from 200 to 260° C. In the above temperature range, the TFE polymer tends to effectively develop adhesiveness based on its elasticity.

The TFE polymer may be a homopolymer of TFE or a copolymer of TFE and another monomer copolymerizable with TFE (hereinafter referred to also as a "comonomer").

The TFE polymer preferably has from 75 to 100 mol % of TFE units and from 0 to 25 mol % of comonomer units, to all units constituting the TFE polymer.

The TFE polymer may, for example, be a polytetrafluoroethylene, a copolymer having TFE units and ethylene units, a copolymer having TFE units and propylene units, a copolymer having TFE units and perfluoro(alkyl vinyl ether) (hereinafter referred to also as "PAVE") units, a copolymer having TFE units and hexafluoropropylene (hereinafter referred to also as "HFP") units, a copolymer having TFE units and fluoroalkylethylene (hereinafter referred to also as "FAE") units, and a copolymer having TFE units and chlorotrifluoroethylene units.

PAVE may, for example, be $CF_2=CFOCF_3$, $CF_2=CFOCF_2CF_3$, $CF_2=CFOCF_2CF_2CF_3$ (hereinafter referred to also as "PPVE"), $CF_2=CFOCF_2CF_2CF_2CF_3$ and $CF_2=CFO(CF_2)_8F$.

FAE may, for example, be $CH_2=CH(CF_2)_2F$, $CH_2=CH(CF_2)_3F$, $CH_2=CH(CF_2)_4F$, $CH_2=CF(CF_2)_3H$ and $CH_2=CF(CF_2)_4H$.

As a suitable one embodiment of the TFE polymer, a polymer having TFE units and PAVE units or HFP units (hereinafter both are collectively referred to as "comonomer units F"), may be mentioned. The polymer in this embodiment preferably has from 90 to 99 mol % of TFE units and from 0.5 to 10 mol % of comonomer units F, to all units constituting the polymer. The polymer in this embodiment may be composed solely of TFE units and comonomer units F, or may further have other units.

As suitable another embodiment of the TFE polymer, a polymer having TFE units (hereinafter referred to also as a "polymer F1") having at least one type of functional groups selected from the group consisting of carbonyl-containing groups, hydroxy groups, epoxy groups, amide groups, amino groups and isocyanate groups (hereinafter simply referred to also as "functional groups") may be mentioned.

When the TFE polymer has functional groups, it will be easy to make the later described rate of change in dielectric loss tangent to be at most 30%. Further, when the TFE polymer has functional groups, it will be easy to make adhesion between the substrate and the metal layer be good in a case where the metal layer is laminated on at least one surface of the present substrate even in a case where the surface of the metal layer in contact with the present substrate is not roughened (for example, in a case where Rzjis is at most 2.0 μm).

The functional groups may be contained in the monomer units in the polymer F1 or in the terminal groups of the main chain of the polymer F1. The latter type of polymer may be a polymer having functional groups as terminal groups derived from a polymerization initiator, a chain transfer agent, etc.

The polymer F1 is preferably a polymer having monomer units having functional groups and TFE units. Further, the polymer F1 in such a case preferably has other units in addition, and particularly preferably has comonomer units F.

As the functional groups, carbonyl group-containing groups are preferred from the viewpoint of adhesiveness with an inorganic filler or a metal layer. The carbonyl group-containing groups may, for example, be carbonate groups, carboxy groups, haloformyl groups, alkoxycarbonyl groups, acid anhydride residues (—C(O)OC(O)—), fatty acid residues, etc., and carboxy groups and acid anhydride residues are preferred.

As the monomer units with functional groups, monomer units with carbonyl group-containing groups, monomer units with hydroxy groups, monomer units with epoxy groups, and monomer units with isocyanate groups are preferred, and monomer units with carbonyl group-containing groups are particularly preferred.

As the monomer having a carbonyl-containing group, a cyclic monomer having an acid anhydride residue, a monomer having a carboxy group, a vinyl ester, and a (meth) acrylate are preferred, and a cyclic monomer having an acid anhydride residue is particularly preferred.

As the above cyclic monomer, itaconic acid anhydride, citraconic acid anhydride, and 5-norbornene-2,3-dicarboxylic anhydride (another name: "Nadic anhydride;" hereinafter referred to also as "NAH") and maleic anhydride are preferred.

The polymer F1 is preferably a polymer comprising monomer units having functional groups, TFE units, and comonomer units F. Specific examples of such polymer F1 may be polymers (X) described in WO2018/16644.

The proportion of TFE units in the polymer F1 is preferably from 90 to 99 mol %, in all units constituting the polymer F1.

The proportion of comonomer units F in the polymer F1 is preferably from 0.5 to 9.97 mol %, in all units constituting the polymer F1.

The proportion of monomer units having functional groups in the polymer F1 is preferably from 0.01 to 3 mol %, in all units constituting the polymer F1.

As the inorganic filler, one with low relative permittivity, dielectric loss tangent and thermal expansion coefficient, is preferred. Such an inorganic filler may, for example, be silica, alumina, glass, stealite, beryllium oxide, aluminum nitride, bitter olivine ceramics, and boron nitride.

The inorganic filler may be porous or non-porous.

The shape of the inorganic filler may be crushed, spherical, oblong spherical, ellipsoidal, needle-like, plate-like, scale-like, rod-like, dice-like, etc., and crushed is preferred. The crushed inorganic filler has many surface irregularities and thus is expected to adhere firmly to the TFE polymer due to its anchoring effect.

One type of the inorganic filler may be used alone, or two or more types may be used in combination.

As the inorganic filler, silica is preferred.

Silica may, for example, be fused silica, fumed silica, non-porous silica, porous silica (mesoporous silica, microporous silica), or hollow silica. Such silica may be used in a dried state, in a sol state or in a slurry state, or may be one in which the silanol groups are reduced by calcination treatment at a temperature of at least 600° C.

The silica is preferably in a crushed form.

The silica may be surface-treated with a surface treatment agent such as a silane coupling agent, a titanate coupling agent, etc. with a view to improving its dispersibility in the TFE polymer.

The inorganic filler may be subjected to alkaline cleaning. By the alkaline cleaning, it is possible to remove water adsorbed on the surface of the inorganic filler, such being effective in lowering the dielectric loss tangent.

The alkali to be used for the alkaline cleaning may, for example, be NaOH, KOH, or a mixed alkalis of these.

As the inorganic filler, silica that has been alkali-cleaned is preferred.

The average particle size of the inorganic filler is preferably at most 100 μm, more preferably at most 60 μm, particularly preferably at most 40 μm. When the average particle size of the inorganic filler is at most the above upper limit value, the inorganic filler is less likely to protrude on the substrate surface in a case where the thickness of the substrate is at most 500 μm, and stable dielectric properties tend to be easily obtained.

The average particle size of the inorganic filler is the volume-based cumulative 50% diameter (D50) determined by the laser diffraction/scattering method. That is, the particle size distribution is measured by the laser diffraction/scattering method, and a cumulative curve is obtained with the total volume of the particle population as 100%, whereby it is a particle size at the point on the cumulative curve where the cumulative volume becomes 50%.

In a case where the inorganic filler is in a crushed form, it is preferred that the inorganic filler is able to pass through a sieve with an opening of 45 μm. When the inorganic filler is able to pass through a sieve with an opening of 45 μm, the inorganic filler is less likely to protrude from the substrate surface in a case where the substrate thickness is at most 500 μm, whereby stable dielectric properties tend to be easily obtained.

The inorganic filler may be one whereby the particle size distribution curve measured by the laser diffraction/scattering method has two or more peaks. For example, when two or more inorganic fillers different in the average particle sizes are used as mixed together, the particle size distribution curve will be one having two or more peaks.

As the amount of the inorganic filler added increases, the inorganic filler comes into contact with each other, creating a region surrounded by the inorganic filler. When the number of peaks is one, the variation in the size of the inorganic filler is relatively small, so it is difficult for another inorganic filler to pass through the gaps between the inorganic filler that make up the region, and it is difficult to further fill the region with another inorganic filler. When the number of peaks is two or more, the variation in the size of the inorganic fillers is relatively large, so it is easy for another inorganic filler to pass through the gaps between the inorganic fillers that make up the region, and it is easy to further fill the region with another inorganic filler and improve the filling ratio.

The substrate may further contain a surfactant.

The surfactant is used, for example, to improve the dispersibility of the resin powder and the miscibility of the inorganic filler in a case of mixing the dispersion of the resin powder containing the TFE polymer and the inorganic filler in the production of the present substrate.

The surfactant may, for example, be a nonionic surfactant, an anionic surfactant, a cationic surfactant, or an amphoteric surfactant, and the most suitable compound is selected as appropriate.

As the surfactant, a nonionic surfactant is preferred because of its low dielectric loss tangent.

As the surfactant, a surfactant having fluorine-containing groups and hydrophilic groups (hereinafter referred to also as a "fluorosurfactant") is preferred. By using a fluorosurfactant, the surface tension of the liquid medium may be lowered, and the wettability of the resin powder on the surface may be improved, whereby the dispersibility of the resin powder may be improved, and the fluorine-containing groups may be adsorbed on the surface of the resin powder containing the TFE polymer, and the hydrophilic groups may extend into the liquid medium, whereby the steric hindrance of the hydrophilic groups may prevent the aggregation of the resin powder, to improve the dispersion stability.

As the fluorine-containing groups, ones with high hydrophobicity are preferred, and, for example, fluorinated hydrocarbon groups such as perfluoroalkyl groups, perfluoroalkenyl groups (such as hexafluoropropylene trimer groups, etc.), etc. may be mentioned. The perfluoroalkyl groups or perfluoroalkenyl groups may, respectively have linear or branched structures. The number of carbons in the fluorine-containing groups is preferably at least 2, more preferably from 4 to 20.

As the fluorine-containing groups, fluorine-containing groups having a branched structure, such as —$CF(CF_3)C(=C(CF_3)_2)(CF(CF_3)_2)$, are preferred, since they are bulky and have excellent adsorption capacity.

The hydrophilic groups are groups which are hydrophilic relative to the fluorine-containing groups, and may be general hydrophilic groups, or groups which are usually considered to be hydrophobic groups, but are hydrophilic relative to the fluorine-containing groups. For example, polyoxypropylene groups are hydrophobic relative to polyoxyethylene groups which are hydrophilic groups, and are usually regarded as hydrophobic groups, but are relatively less hydrophobic (more hydrophilic) to fluorine-containing groups, and thus are hydrophilic groups in the present invention.

The hydrophilic groups may be polyoxyethylene groups, polyoxypropylene groups, polyoxybutylene groups, polyoxytetramethylene groups, amino groups, ketone groups, carboxyl groups, and sulfone groups. As the hydrophilic groups, polyoxyalkylene groups consisting of C2-4 oxyalkylene groups are preferred, and polyoxyethylene groups are particularly preferred.

The fluorosurfactant may also be a copolymer of a monomer having a fluorine-containing group and a monomer having a hydrophilic group. As such a surfactant, a copolymer of a monomer having a fluorine-containing group and a monomer having a polyoxyalkylene group, is particularly preferred.

In a case where the fluorosurfactant is a copolymer of a monomer having a fluorine-containing group and a monomer having a hydrophilic group, the weight average molecular weight of the fluorosurfactant is preferably from 1,000 to 150,000, more preferably from 3,000 to 100,000, particularly preferably from 5,000 to 30,000. In such a case, the fluorine-containing groups tend to be more easily adsorbed to the surface of the resin powder than to the liquid medium, whereby the dispersibility and dispersion stability of the resin powder tend to be easily improved. In addition, the dispersion liquid in which the resin powder is dispersed can be made to be one having excellent mixability and coatability with different resin materials or their varnishes.

The weight average molecular weight of the fluorosurfactant is measured by gel permeation chromatography (GPC).

Specific examples of the fluorosurfactant may be the perfluoroalkyl group-containing Ftergent M series, Ftergent F209, Ftergent 222F, Ftergent 208G, Ftergent 218GL, Ftergent 710FL, Ftergent 710FM, Ftergent 710FS, Ftergent 730FL, Ftergent 730LM (manufactured by NEOS COMPANY LIMITED), Megaface series (manufactured by DIC Corporation) such as Megaface F-553, Megaface F-555, Megaface F-556, Megaface F-557, Megaface F-559, Megaface F-562, Megaface F-565, etc., Unidyne series (manufactured by Daikin Industries) such as Unidyne DS-403N, etc. Among them, Ftergent 710FL, Ftergent 710FM and Ftergent 710FS, being surfactants in which the fluorine-containing groups have a branched structure to have steric bulk, are preferred.

Two or more surfactants may be used in combination. In such a case, at least some of the two or more surfactants should preferably be fluorinated surfactants. Some of the two or more surfactants may be surfactants that do not have fluorine-containing groups.

The present substrate may further contain other components other than the TFE polymer, the inorganic filler and the surfactant, as the case requires, within a range where the effects of the present invention are not impaired.

Other components may, for example, be a resin other than the TFE polymer (e.g. a polyimide), a thickener, etc.

In the present substrate, the proportion of the volume of the inorganic filler to the total volume of the TFE polymer and the inorganic filler is preferably from 40 to 90 vol %, more preferably from 45 to 85 vol %, particularly preferably from 50 to 80 vol %. When the proportion of the inorganic filler is at least the above lower limit value, the thermal expansion coefficient and dielectric loss tangent of the substrate can be made to be lower. When the proportion of the inorganic filler is at most the above upper limit value, the relative permittivity of the substrate can be made to be lower and the mechanical strength can be made to be higher.

The volume is the value at 25° C.

The proportion of the total volume of the TFE polymer and the inorganic filler to the total volume of the present substrate is preferably at least 80 vol %, more preferably at least 90 vol %, particularly preferably at least 95 vol %. When the proportion of the total volume of the TFE polymer and the inorganic filler is at least the above lower limit value, the dielectric loss tangent, relative permittivity and thermal expansion coefficient of the substrate can be made to be lower and its mechanical strength can be made to be higher.

The content of the surfactant is preferably from 1 to 30 mass %, more preferably from 2 to 10 mass % to the total mass of the TFE polymer and the inorganic filler.

The thickness of the present substrate is preferably from 60 to 500 μm, more preferably from 80 to 400 μm, further preferably from 100 to 300 μm. When the thickness of the substrate is at most the above upper limit value, the mountability will be more excellent. When the thickness of the substrate is at least the above lower limit value, the substrate rigidity will be more excellent.

Of the present substrate, the rate of change in dielectric loss tangent before and after 72 hours of USPCT at 120° C. under 85% RH on a specimen of 127 μm thickness cut out from the present substrate, is at most 30%. The said rate of change is preferably at most 25%, more preferably at most 20%. When the above rate of change is at most the above upper limit value, the substrate will be excellent in mechanical strength and is less likely to be destroyed when the substrate is bent or when vibration is applied to the substrate. Therefore, by using the present substrate, it is possible to obtain a highly reliable printed wiring board.

The rate of change in dielectric loss tangent is considered to indicate the amount of voids at the interface between the TFE polymer and the inorganic filler in the present substrate. If there are a lot of voids at the interface, moisture will enter the voids during USPCT and will be adsorbed on the surface of the inorganic filler. As a result, the moisture content of the substrate will increase, and the dielectric loss tangent becomes higher. When the rate of change in dielectric loss tangent is at most the above upper limit value, there will be no or only a few voids at the interface between the TFE polymer and the inorganic filler in the present substrate, and they are sufficiently adhered to each other, so the mechanical strength is considered to be excellent.

The present substrate can be produced, for example, by preparing a paste composition containing the TFE polymer, inorganic filler and liquid medium, applying the paste composition on the adherend, followed by drying and firing. As a result, the present substrate is formed on the adherend. As the case requires, the present substrate is peeled off from the adherend. When the present substrate is to be used for a metal laminate, a material (such as a metal foil) capable of forming a metal layer may be used as the adherend, and the present substrate may be used for the metal laminate without being peeled off.

As the liquid medium, an inorganic solvent such as water, an organic solvent, etc. may be used. As the organic solvent, for example, organic solvents described in WO2018/16644 may be mentioned. The liquid medium may be a mixture of two or more compatible liquid media. For example, it may be a mixture of a water-soluble organic solvent and water, or it may be a mixture of two or more organic solvents.

As the liquid medium, one that can dissolve the TFE polymer is preferred.

In the paste composition, the content of the liquid medium is preferably from 30 to 95 parts by mass, more preferably from 40 to 90 parts by mass, particularly preferably from 50 to 85 parts by mass, to the total 100 parts by mass of the TFE polymer and the inorganic filler. When the content of the liquid medium is at least the above lower limit value, the surface smoothness of the substrate to be formed will be more excellent. When the content of the liquid medium is at most the above upper limit value, the thick film coating property will be more excellent.

The paste composition can be prepared by mixing the TFE polymer, the inorganic filler and the liquid medium. As the case requires, a surfactant or other components may be mixed together with these materials.

More specifically, the preparation method for the paste composition may be a method of adding the inorganic filler to a solution of the TFE polymer or a dispersion of a resin powder containing the TFE polymer and mixing them, or a method of mixing a solution of the TFE polymer or a dispersion of a resin powder containing the TFE polymer and a dispersion of the inorganic filler (the Let-down method). The respective materials can be mixed by using a mixing device such as a rotary shear type agitator, a colloid mill, a roll mill, an ultrasonic disperser, a vessel-driven mill, or a media agitation mill.

The mixing conditions for preparing the paste composition are set so that the rate of change in dielectric loss tangent as described above will be at most 30%.

The rate of change in dielectric loss tangent can be adjusted, for example, by the strength of shear at the time of mixing the respective materials. By mixing with stronger shear, the rate of change in dielectric loss tangent can be reduced. This is considered to be because stronger shear prevents the formation of voids at the interface between the TFE polymer and the inorganic filler.

The method of applying the paste composition is not particularly limited. For example, it can be applied by using a coating device such as a spinner, a screen printing, a blade coater, a die coater, etc.

The drying method of the applied paste composition is also not particularly limited. For example, a method of heating by using a heating device such as a hot plate, an oven, etc. may be mentioned. The heating conditions are good as long as the liquid medium can be removed, and can be set suitably depending upon the type of the liquid medium.

The tensile strength of the present substrate is preferably at least 7.0 MPa, more preferably at least 8.0 MPa, further preferably at least 10.0 MPa. The tensile modulus is preferably at least 1.0 GPa, more preferably at least 1.5 GPa, further preferably at least 2.0 GPa.

The present substrate as described above comprises the TFE polymer and the inorganic filler, and of which, the rate of change in dielectric loss tangent under specific conditions is at most 30%, whereby it has low dielectric loss tangent, relative permittivity and thermal expansion coefficient, and also is excellent in mechanical strength.

In particular, when the TFE polymer has functional groups, it will be easier to obtain better mechanical strength. The adhesion between the present substrate and the metal layer will also be excellent.

[Metal Laminate]

The metal laminate of the present invention has the present substrate and a metal layer located in contact with at least one surface of the present substrate.

The metal laminate may have one or more present substrates. In a case where it has multiple present substrates, the respective substrates may be the same or different.

The metal laminate may have one or more metal layers. In a case where it has multiple metal layers, the respective metal layers may be the same or different.

In addition to the present substrate and the metal layer, the metal laminate may further have another substrate (e.g. a FR4 substrate, a LCP (liquid crystal polymer) substrate, a PPE (polyphenylene ether) substrate), etc. FR4 stands for "Flame Retardant Type 4," which is a glass fiber cloth soaked in epoxy resin and thermoset to form a plate.

FIG. 1 shows an example of the metal laminate of the present invention. The metal laminate 1 in this example is a single-sided metal laminate having a substrate 3 and a metal layer 5 located in contact with one surface 3a of this substrate 3. The substrate 3 is the present substrate.

FIG. 2 shows another example of the metal laminate of the present invention. The metal laminate 1 in this example is a double-sided metal laminate having a substrate 3 and metal layers 5 located in contact with one surface 3a and the other surface 3b of the substrate 3, respectively.

The metal to constitute the metal layer may be copper, a copper alloy, stainless steel, nickel, a nickel alloy (including 42 alloy), aluminum, an aluminum alloy, titanium, a titanium alloy, etc. Copper is preferred due to its electrical conductivity and chemical resistance.

As the metal layer, a layer consisting of a metal foil is preferred, and especially a layer consisting of a copper foil is preferred. The copper foil may be a rolled copper foil, an electrolytic copper foil, etc. An anti-corrosion layer (e.g. an oxide film such as chromate), a heat-resistant layer, or the like, may be formed on the surface of the metal foil.

The thickness of the metal layer is preferably from 1 to 40 μm, more preferably from 10 to 30 μm.

The surface of the metal layer may be treated with a silane coupling agent. In such a case, the entire surface of the metal layer may be treated with the silane coupling agent, or a portion of the surface of the metal layer may be treated with the silane coupling agent.

Rzjis of the surface of the metal layer in contact with the present substrate is preferably at most 5.0 μm, more preferably at most 3.0 μm, further preferably at most 2.0 μm, particularly preferably at most 1.0 μm. When Rzjis is at most the above upper limit value, it will be easy to obtain a printed wiring board with excellent transmission characteristics. Rzjis is preferably smaller from the viewpoint of the transmission characteristics, and the lower limit of Rzjis is not particularly limited, but is, for example, 0.1 μm.

The peel strength of the interface between the present substrate and the metal layer is preferably at least 5 N/cm, more preferably at least 8 N/cm. When the peel strength is at least the above lower limit value, the reliability will be more excellent. The higher the peel strength, the more desirable it is, and the upper limit of the peel strength is not particularly limited.

The metal laminate of the present invention can be produced, for example, by (1) a method of laminating a material capable of forming a metal layer on at least one surface of the present substrate, followed by thermocompression bonding, (2) a method of forming the present substrate on a material capable of forming a metal layer and, as the case requires, laminating another material capable of forming a metal layer on the surface of the formed present substrate, followed by thermocompression bonding, or (3) a method of preparing two, each having the present substrate formed on a material capable of forming a metal layer, and laminating them so that the substrate sides are bonded to each other, followed by thermocompression bonding.

As the material capable of forming a metal layer, for example, a metal foil may be mentioned.

In the methods (1), (2) and (3), the temperature at the time of the thermocompression bonding is at least the melting point of the TFE polymer, preferably higher by at least 10° C. than the melting point, more preferably higher by at least 20° C. than the melting point, particularly preferably higher by at least 40° C. than the melting point. The temperature at the time of the thermocompression bonding is preferably not to exceed the temperature higher by 100° C. than the melting point. When the temperature at the time of the thermocompression bonding is within the above range, the substrate and the metal layer can be sufficiently bonded while suppressing thermal degradation of the TFE polymer.

The temperature at the time of the thermocompression bonding is the temperature of the heating plate of the crimping machine.

The pressure at the time of the thermocompression bonding is preferably at least 0.2 MPa, more preferably at least 0.5 MPa, further preferably at least 1.0 MPa. The pressure at the time of the thermocompression bonding is preferably at most 10.0 MPa. When the pressure at the time of the thermocompression bonding is within the above range, the present substrate and the metal layer can be sufficiently bonded without damaging the present substrate.

The thermocompression bonding is preferably conducted under a vacuum atmosphere. The degree of vacuum at the time of the thermocompression bonding is preferably at most 100 kPa, more preferably at most 50 kPa, further preferably at most 20 kPa. When the degree of vacuum is at most the above upper limit value, air bubbles can be prevented from entering the respective interfaces of the main substrate and the metal layer that constitute the metal laminate, and at the same time, deterioration of the metal layer due to oxidation can also be prevented.

Further, it is preferred to raise the temperature after the above vacuum level is reached. If the temperature is raised before the above vacuum level is reached, bubbles will be caused.

In the thermocompression bonding, it is preferred to apply pressure after the temperature of the substrate reaches the melting point. If the thermocompression bonding is conducted before the melting point is reached, voids may occur between the present substrate and the metal layer, or uneven adhesion strength may occur.

In the methods (2) and (3), in order to form the present substrate on a material capable of forming a metal layer, for example, a paste composition comprising the TFE polymer, the inorganic filler and the liquid medium may be prepared as described above, and the paste composition may be applied to the material (adherend) capable of forming the metal layer and dried.

EXAMPLES

In the following, the present invention will be described in detail with reference to Examples, but the present invention is not limited by the following description. Ex. 1 is an Example of the present invention, and Ex. 2 is a Comparative Example.

(Proportions of the Respective Units in TFE Polymer)

The proportion of NAH units was obtained by an infrared absorption spectrum analysis. The proportions of units other than NAH units were obtained by a melt NMR analysis and a fluorine content analysis.

<Infrared Absorption Spectrum Analysis>

The TFE polymer was press-molded to obtain a film with a thickness of 200 μm. The film was analyzed by infrared spectroscopy to obtain the infrared absorption spectrum. In the infrared absorption spectrum, the absorption peak of NAH units in the TFE polymer appears at 1,778 cm$^{-1}$. The absorbance of this absorption peak was measured, and the proportion of NAH units in the TFE polymer was obtained by using the molar absorption coefficient 20,810 mol$^{-1}$·L·cm$^{-1}$ of NAH.

(Melting Point)

Using a differential scanning calorimeter (manufactured by Seiko Instruments Inc., DSC-7020), the melting peak was recorded when the TFE polymer was heated at a rate of 10° C./min, whereby the temperature (° C.) corresponding to the maximum value was adopted as the melting point.

(MFR)

Using a melt indexer (manufactured by Technol Seven Co., Ltd.), at 372° C. and under a 49 N load, the mass (g) of the TFE polymer flowing out of a nozzle with a diameter of 2 mm and a length of 8 mm in 10 minutes, was measured and adopted as MFR.

(Storage Modulus)

In accordance with ISO 6721-4:1994, using a dynamic rheological apparatus (manufactured by SII Nano Technology, DMS6100), under conditions of a frequency of 10 Hz, a static force of 0.98 N and a dynamic displacement of 0.035%, the TFE polymer was heated from 20° C. at a rate of 2° C./min, and the storage modulus at 260° C. was measured.

(Average Particle Size of Granular Polymer)

A 2.000-mesh sieve (2.400 mm mesh opening), a 1.410-mesh sieve (1.705 mm mesh opening), a 1.000-mesh sieve (1.205 mm mesh opening), a 0.710-mesh sieve (0.855 mm mesh opening), a 0.500-mesh sieve (0.605 mm mesh opening), a 0.250-mesh sieve (0.375 mm mesh opening), a 0.149-mesh sieve (0.100 mm mesh opening) and a receiving tray, were stacked in this order from the top. A sample (polymer) was put from the top and sieved by a shaker for 30 minutes. After that, the mass of the sample remaining on each sieve was measured, and the accumulated mass passed through for each mesh opening value was represented on a graph, and the particle size at the time when the accumulated mass passed through was 50% was adopted as the average particle size of the sample.

(D50 and D90 of Resin Powder)

Using a laser diffraction/scattering particle size analyzer (manufactured by Horiba, Ltd., LA-920 measuring instrument), the resin powder was dispersed in water, and the particle size distribution on a volume basis was measured to obtain D50 and D90.

(Average Particle Size of Silica)

Using a laser diffraction/scattering particle size analyzer (manufactured by Nikkiso Co., Ltd., MICROTRAC HRA DHSX100), silica was dispersed in water, and the particle size distribution on a volume basis was measured to obtain the average particle size (D50).

(Relative Permittivity and Dielectric Loss Tangent)

With respect to the substrate (127 µm thick), the relative permittivity and dielectric loss tangent were measured at 25° C. and 10 GHz using a cavity resonator and a vector network analyzer in accordance with the method specified in JIS R 1641:2007.

The substrate was obtained by removing the copper foil of the later-described composite CCL by ferric chloride (the same applies hereinafter).

(Thermal Expansion Coefficient)

A test specimen of 10 mm×10 mm was cut out from the substrate. With respect to this specimen, the coefficient of linear expansion CTE (z) in the thickness direction was measured by using a thermo-mechanical analyzer (manufactured by NETZSCH, TMA402 F1 Hyperion). Specifically, in a nitrogen atmosphere, by setting the load at 19.6 mN, the sample was heated at a rate of 2° C./min in the temperature range of from −65° C. to 150° C., and the displacement of the thickness of the sample was measured. After completion of the measurement, the coefficient of linear expansion (CTE) from −40 to 125° C. was obtained from the displacement of the sample from −40° C. to 125° C.

(Change in Dielectric Loss Tangent By USPCT)

A test specimen of 35 mm in length×35 mm in width was cut out from the substrate. The specimen was introduced in a pressure cooker at 120° C. under 85% RH, and USPCT was conducted. With respect to the specimen after 5, 24, 48 and 72 hours after the introduction, the dielectric loss tangent (tan δ) was measured, and the rate of change in dielectric loss tangent before and after USPCT was calculated by the above-described formula (1).

(Mechanical Strength)

A test specimen of 60 mm in length×5 mm in width was cut out from the substrate. The specimen was bent at 180° with a radius of curvature of 2 mm at a position of 30 mm from one end in the length direction, alternately in the forward and reverse directions, for 100 repetitions. Then, the substrate was visually observed and evaluated in accordance with the following standards.

○ (Acceptable): There was no breakage of the substrate, and no cracks or fissures appeared.

x (Unacceptable): Cracks or fissures appeared on the substrate.

(Peel Strength)

A rectangular test specimen of 100 mm in length×10 mm in width was cut out from the composite CCL as described later. The copper foil was peeled off from the substrate to a position 10 mm from one end in the length direction of the specimen. One end of the peeled copper foil was subjected to 90° peeling at a tensile speed of 50 mm/min by using a tensile testing machine (manufactured by Shimadzu Corporation, Autograph AGS-X), and the maximum load was adopted as the peel strength (N/cm).

(Transmission Loss)

A grounded coplanar line (G-CPW) with a line length of 12.5 mm was fabricated in the composite CCL as described later, and the transmission loss at 80 GHz was measured. The impedance is 50Ω.

Production Example 1

Polymer X being a TFE polymer, was produced according to the procedure described in [0123] of WO2016/017801 by using NAH (Nadic anhydride, manufactured by Hitachi Chemical Co., Ltd.), TFE and PPVE ($CF_2=CFO(CF_2)_3F$, manufactured by AGC Inc.) as monomers.

The copolymerization composition of polymer X was NAH units/TFE units/PPVE units=0.1/97.9/2.0 (mol %). The melting point of polymer X was 300° C., MFR was 17.6 g/10 min, the relative permittivity (10 GHz) was 2.0, and the storage modulus at 260° C. was 1.1 MPa. Further, the obtained polymer X was granular, and its average particle size was 1,554 µm.

Polymer X was then milled by using a jet mill (Single Track Jet Mill Model FS-4, manufactured by Seishin Enterprise Co., Ltd.) under conditions of a milling pressure of 0.5 MPa and a processing speed of 1 kg/hr to obtain resin powder P-1. D50 of resin powder P-1 was 2.58 µm, and D90 was 7.1 µm.

Ex. 1

Silica (manufactured by Tatsumori Ltd., crushed silica E-1, average particle size: 11 µm) was divided by using a sieve shaker ANALYSETTE 3 manufactured by Fritsch, and silica that passed through a sieve with a 45 µm mesh opening was recovered. The average particle size of the recovered silica was 10 µm.

One hundred grams of resin powder P-1, 6 g of nonionic fluorosurfactant (manufactured by NEOS COMPANY LIMITED, Ftergent 710FL), 137 g of cyclohexanone, and 151 g of silica recovered as described above, were put into a pot and vibration-mixed by a low-frequency resonant acoustic mixer (LabMASII) manufactured by Resodyn, for 20 minutes while applying an acceleration of about 80 G, to obtain a slurry.

The above slurry was applied to the surface of an 18 µm thick copper foil (TQ-M4-VSP, manufactured by Mitsui Mining & Smelting Co., Ltd.) in a thickness of 200 µm by the doctor blade method, dried for 12 hours in a room temperature atmospheric environment, and then heated and dried at 350° C. for 20 minutes under a nitrogen atmosphere to form the substrate. As a result, a single-sided copper clad laminate with a copper foil laminated on one surface of the substrate, was obtained. Rzjis on the surface of the copper foil, where the slurry was applied, was 0.6 µm.

The same copper foil as described above was laminated on the surface of the substrate side of the above single-sided copper clad laminate and pressed in a vacuum hot press device at a temperature of 330° C. for 60 minutes while applying a pressure of 8 MPa to obtain a double-sided copper clad laminate. This double-sided copper clad laminate will be hereinafter referred to as the "composite CCL".

In the obtained composite CCL substrate, the proportion of the volume of silica to the total volume of polymer X and silica was 60 vol %, the proportion of the total volume of polymer X and silica to the entire volume of the substrate was 100 vol %, and the thickness of the substrate was 127 µm.

Ex. 2

A commercially available composite CCL (manufactured by Rogers Corporation, RO3003) was used as the composite CCL in Ex. 2.

The substrate of this composite CCL contained polytetrafluoroethylene (PTFE) and silica, the proportion of the volume of silica to the total volume of PTFE and silica was 50 vol %, the proportion of the total volume of PTFE and silica to the entire volume of the substrate was 95 vol %, and the thickness of the substrate was 127 µm. Rzjis on the surface of the copper foil in contact with the substrate was 7.0 µm.

Figure 3:
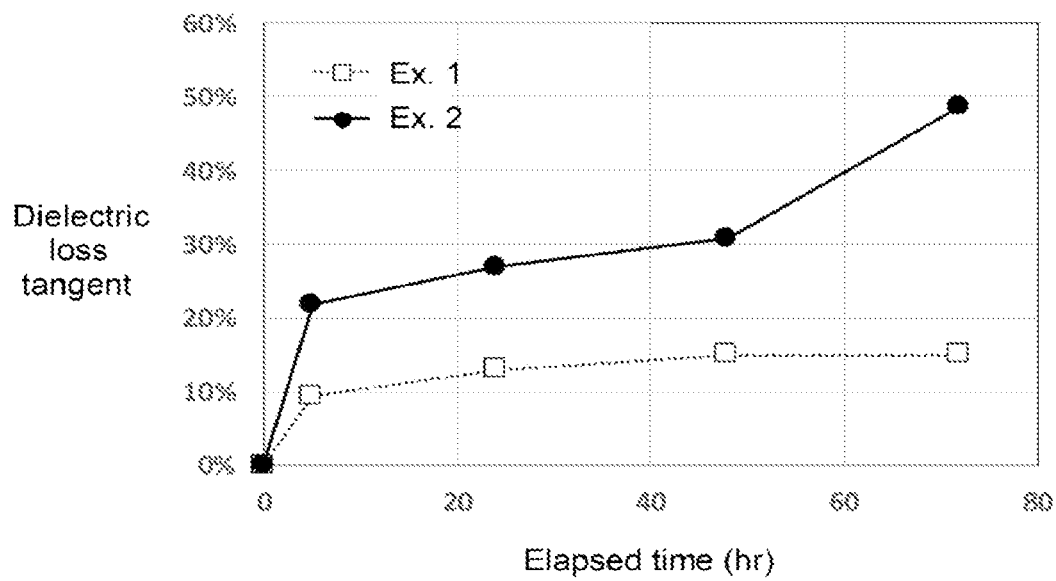
FIG. 3 is a graph showing the dependence of the rate of change in dielectric loss tangent before and after the unsaturated pressure cooker test for the substrates in Ex. 1 and Ex. 2, on the time subjected to the unsaturated pressure cooker test.

With respect to the composite CCL in each Ex., the above evaluations were conducted. The relative permittivity, dielectric loss tangent, CTE, transmission loss, mechanical strength, copper foil peel strength (all before USPCT), and the rate of change in dielectric loss tangent before and after 72 hours of USPCT, are shown in Table 1. The relative permittivity, dielectric loss tangent and the rate of change in dielectric loss tangent before and after 72 hours of USPCT, are values at 10 GHz. Further, FIG. 3 shows the relationship between the elapsed time after the pressure cooker is turned on (USPCT turn-on time) and the rate of change in dielectric loss tangent (dependence of the rate of change in the dielectric loss tangent on USPCT turn-on time) in Ex. 1 and 2.

TABLE 2

|  | Tensile strength (MPa) | Tensile modulus (GPa) |
| --- | --- | --- |
| Ex. 1 | 12.2 | 2.3 |
| Ex. 2 | 4.7 | 0.8 |

The substrate in Ex. 1 was excellent in mechanical strength. Further, the transmission loss was small, since it was possible to use a low roughness copper foil.

The substrate in Ex. 2, where the rate of change in dielectric loss tangent before and after 72 hour of USPCT exceeded 30%, was inferior in mechanical strength. Further, the transmission loss was large, since it was not possible to use a low roughness copper foil.

Further, the substrate in Ex. 1 was superior in each of the tensile strength and tensile modulus as compared to the substrate in Ex. 2.

INDUSTRIAL APPLICABILITY

According to the present invention, it is possible to provide a substrate and a metal laminate with low relative permittivity, dielectric loss tangent, transmission loss and thermal expansion coefficient, as well as high mechanical strength. Because of the high mechanical strength, the substrate and metal laminate of the present invention can be used to form a highly reliable printed wiring board even in an environment with vibration, such as an automobile.

This application is a continuation of PCT Application No. PCT/JP2020/029101, filed on Jul. 29, 2020, which is based upon and claims the benefit of priority from Japanese Patent Application No. 2019-144495 filed on Aug. 6, 2019. The contents of those applications are incorporated herein by reference in their entireties.

TABLE 1

| | Before USPCT | | | | | | Rate of change in dielectric loss tangent before and after USPCT for 72 hours (%) |
| --- | --- | --- | --- | --- | --- | --- | --- |
| | Relative permittivity | Dielectric loss tangent | CTE (ppm/° C.) | Transmission loss (dB/cm) | Mechanical strength | Copper foil peel strength (N/cm) | |
| Ex. 1 | 2.7 | 0.0014 | 17 | −0.4 | ○ | 8 | 15 |
| Ex. 2 | 3 | 0.0008 | 17 | −0.8 | X | 20 | 49 |

(Tensile Strength)

A test specimen with a width of 20 mm, a length of 200 mm and a thickness of 125 µm cut from the substrate was clamped at 25 mm from the end, and a load was applied to the specimen at a tensile speed of 1 mm/min at room temperature by using a tensile testing machine (manufactured by Shimadzu Corporation, Autograph AGX), whereby the load and the elongation (strain) of the specimen were measured and a stress-strain curve was obtained. The tensile strength is the value obtained by dividing the breaking strength or yield strength in the stress-strain curve by the cross-sectional area of the specimen.

(Tensile Modulus)

The tensile modulus is the slope of the region (elastic deformation region) where the tensile strength becomes linearly stronger in proportion to the strain in the stress-strain curve.

The tensile rupture strength and tensile modulus are shown in Table 2.

What is claimed is:

1. A substrate comprising a tetrafluoroethylene polymer and an inorganic filler, wherein the proportion of the total volume of the tetrafluoroethylene polymer and the inorganic filler to the total volume of the present substrate is at least 80 vol %, and the substrate has a rate of change in dielectric loss tangent at 10 GHz before and after 72 hours of unsaturated pressure cooker test at 120° C. under 85% RH on a 127-µm thick specimen cut out from the substrate is at most 30%,
wherein the tetrafluoroethylene polymer is a polymer having at least one type of functional groups selected from the group consisting of carbonyl group-containing groups, hydroxy groups, epoxy groups, amide groups, amino groups and isocyanate groups.

2. The substrate according to claim 1, wherein the polymer having the functional groups is a polymer having monomer units having the functional groups.

3. The substrate according to claim 1, wherein the inorganic filler is silica.

4. The substrate according to claim 1, wherein the thickness of the substrate is from 60 to 500 µm.

5. The substrate according to claim 1, wherein the substrate further contains a surfactant.

6. The substrate according to claim 5, wherein the surfactant is a fluorosurfactant.

7. A metal laminate having a substrate as defined in claim 1 and a metal layer located in contact with at least one surface of the substrate.

8. The metal laminate according to claim 7, wherein the metal layer is a layer made of a copper foil.

9. The metal laminate according to claim 7, wherein the metal laminate has a ten-point average roughness of the surface of the metal layer in contact with the substrate is at most 2.0 μm.

10. The metal laminate according to claim 7, wherein the peel strength of the interface between the substrate and the metal layer is at least 5 N/cm.

* * * * *